United States Patent
Ma

(10) Patent No.: US 6,552,595 B1
(45) Date of Patent: Apr. 22, 2003

(54) CURRENT-CONTROLLED HIGH VOLTAGE DISCHARGE SCHEME

(75) Inventor: Benny Ma, Saratoga, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/318,570

(22) Filed: May 26, 1999

(51) Int. Cl.[7] ............... H03K 5/00; H03L 5/00
(52) U.S. Cl. ............ 327/313; 327/328; 327/379
(58) Field of Search ................. 327/313, 327, 327/328, 534, 538, 540, 541, 543, 545, 546, 379, 384, 387

(56) References Cited

U.S. PATENT DOCUMENTS

| | | | | |
|---|---|---|---|---|
| 4,450,367 A | * | 5/1984 | Whatley | 327/538 |
| 5,326,988 A | * | 7/1994 | Ishida | 257/288 |
| 5,349,287 A | * | 9/1994 | Lorenz | 323/315 |
| 5,748,015 A | * | 5/1998 | Tam | 327/51 |
| 5,801,578 A | * | 9/1998 | Bereza | 327/157 |
| 5,914,586 A | * | 6/1999 | Fujita et al. | 320/136 |
| 6,072,359 A | * | 6/2000 | Brambilla | 327/538 |

* cited by examiner

Primary Examiner—Terry D. Cunningham
Assistant Examiner—Quan Tra
(74) Attorney, Agent, or Firm—MacPherson Kwok Chen & Heid LLP

(57) ABSTRACT

In a programmable integrated circuit, a discharge circuit for discharging high voltage nodes provides a current path whose current is limited by a control voltage. In one embodiment, the current path is implemented by a transistor coupled to the high voltage nodes, with the control voltage provided by a current mirror coupled to the current path. The control voltage is applied across the gate and source terminals of the transistor. In one embodiment, the source terminal of the transistor is precharged to a supply voltage less a threshold voltage of a transistor. With the current in the current path thus limited, threshold voltage shifts and other damages to the functional circuit of the integrated circuit due to the discharge current of high voltage nodes are avoided.

6 Claims, 2 Drawing Sheets

CURRENT-CONTROLLED HIGH VOLTAGE DISCHARGE SCHEME

BACKGROUND OF THE INVENTION

1. Field of the Invention

The present invention relates to a programmable integrated circuit. In particular, the present invention relates to discharging high voltage nodes associated with programming and erasing of a programmable integrated circuit.

2. Discussion of the Related Art

A programmable integrated circuit, such a programmable logic device ("PLD"), is programmed or erased during a "programming mode." During the programming mode, the programmable integrated circuit is configured by storing appropriate values into the programmable integrated circuit's non-volatile memory components (e.g., "architecture cells"). Once programmed, the programmable integrated circuit can be put to functional operations under a "user mode."

In some programmable integrated circuits, a high voltage is used to store selected values in the architecture cells during programming mode. Typically, nodes in the programmable integrated circuit that are brought to the high voltage have to be discharged before the next operation can be carried out. During discharge, the electric field at the drain terminal of the discharging transistor at the high voltage can be so high that it creates energetic charges ("hot carriers") that create an undesirable localized substrate current. The hot carriers can also be injected into the gate oxide of a transistor to cause a threshold voltage shift in the transistor, thereby degrading performance and creating a reliability problem. For a programmable integrated circuit with a large number of high voltage nodes to be discharged, the total current resulting from the many localized substrate currents can cause either the localized substrate voltage of the discharging transistors to be pulled up to positive voltage (thus causing a "snap-back" condition), or the global substrate to be pulled up to a positive voltage (thus causing a "latch-up" condition). Either condition is detrimental to proper circuit operation and can potentially damage the device. Therefore, the high voltage discharge scheme must be carefully designed to limit the total discharge current.

SUMMARY OF THE INVENTION

The present invention provides a method and a discharge circuit for discharging a high voltage node. In one embodiment of the present invention, the discharge circuit includes (a) a current path providing between a high voltage node to a desirable reference voltage level, with the current path conducting a current whose magnitude is limited by a control voltage; (b) a reference circuit that limits the total discharge current when multiple high voltage nodes are discharged; and (c) a reference voltage circuit for generating the control voltage that limits the current. In one embodiment, the current path includes a transistor coupled between the high voltage node and the ground voltage, and the control voltage is provided across the gate and source terminals of the transistor. In one implementation, the reference voltage circuit includes a current source coupled to the transistor in a current mirror configuration.

In one embodiment, the discharge circuit further includes a voltage detection circuit coupled for detecting the voltage at the source terminal of the discharging transistor. In that embodiment, the voltage detection circuit provides an output control signal indicating that the high voltage node is discharged to a voltage level that would allow the next operation to be carried out. Further, the discharge circuit includes an enable circuit latching the output control signal of the voltage detection circuit. The enable circuit allows control signals of functional operations to be propagated, thereby allowing functional operations after the high voltage nodes are discharged.

By limiting the current in the discharge current path under the present invention, threshold shifts, latch-up conditions and other damages or interference with the proper functional operations of the functional circuit resulting from hot carriers in the discharging of high voltage nodes are avoided.

The present invention is better understood upon consideration of the detailed description below and the accompanying drawings.

DETAILED DESCRIPTION OF THE PREFERRED EMBODIMENTS

Figure 1:
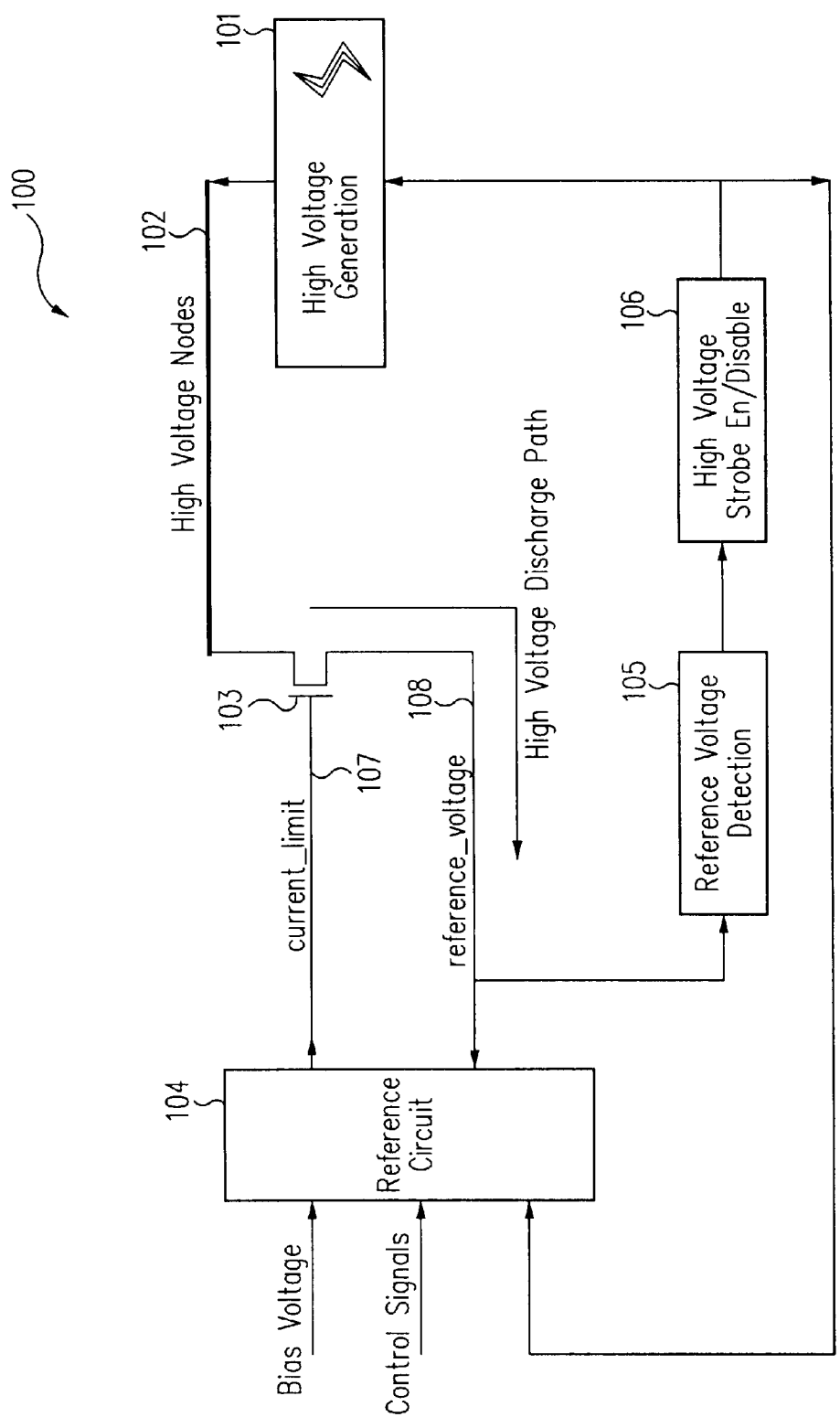
FIG. 1 is a block diagram of a high voltage discharge circuit 100 in accordance with one embodiment of the present invention.

FIG. 1 is a block diagram of a high voltage discharge circuit 100 in a programmable integrated circuit, in accordance with one embodiment of the present invention. As shown in FIG. 1, high voltage generation circuit 101 creates high voltage nodes 102 associated with the programming of non-volatile memory components in the programmable integrated circuit. High voltage nodes are discharged through transistor 103, which current is limited by a bias voltage at gate terminal 107. The voltage at source terminal 108 of transistor 103 is detected by reference voltage detection circuit 105, which enables high voltage strobe enable/disable circuit 106 to allow a strobe signal to propagate upon complete discharge of high voltage nodes 102. Reference voltage circuit 104 provides the bias voltage at gate terminal 107.

Figure 2:
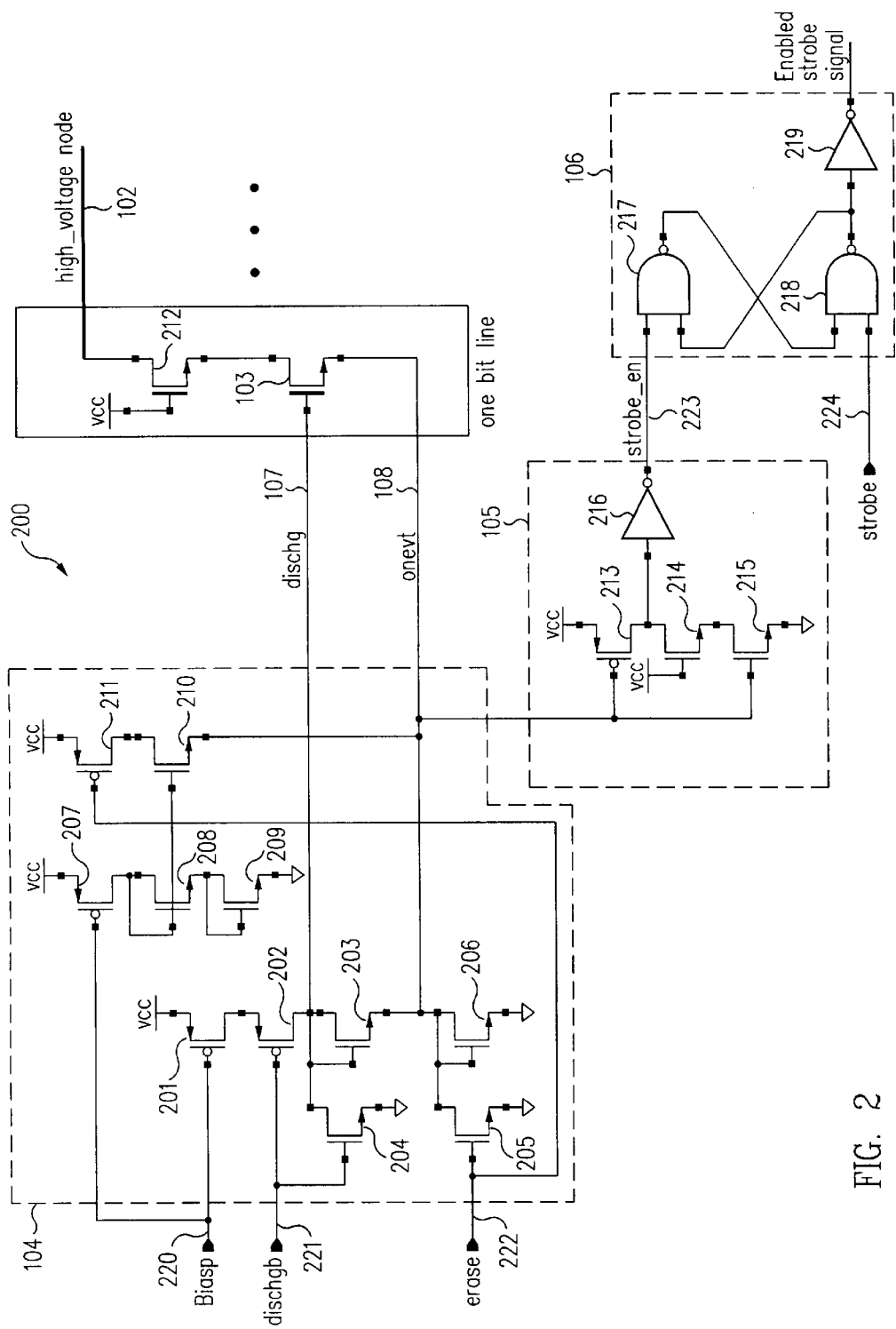
FIG. 2 is a schematic circuit diagram of high voltage discharge circuit 200, which is one implementation of high voltage discharge circuit 100.

FIG. 2 is a schematic diagram of high voltage discharge circuit 200, which is one implementation of high voltage discharge circuit 100 of FIG. 1. To facilitate cross-reference between FIGS. 1 and 2, like elements of these figures are provided like reference numerals. In this embodiment, high voltage discharge circuit 200 is implemented in a non-volatile memory structure with a large number of bit lines. As shown in FIG. 2, high voltage nodes 102 associated with a bit line is discharged through NMOS transistor 212 and 103. NMOS transistor 212, with its gate terminal connected to supply voltage $V_{CC}$, relieves the stress on NMOS transistor 103. The gate terminals of NMOS transistors 212 and 103 are shown in FIG. 2 with a thick line to indicate that they are provided a thick oxide to minimize threshold voltage shifts due to exposure to hot carriers during high voltage operations. NMOS transistor 103 is biased by a reference voltage at its gate terminal 107 set by reference voltage circuit 104, so that the current through NMOS transistor 103 does not exceed a preset value.

Reference voltage circuit 104 receives at terminal 220 a biased voltage "Biasp". Biased voltage Biasp at terminal 220 enables each of PMOS transistors 201 and 207 to be conducting at a predetermined current that is necessary to discharge a high voltage node. Reference voltage circuit 104 also receives CMOS logic level control signals "dischgb" and "erase" at terminals 221 and 222, respectively. Control signal "dischgb" is an "active-low" logic signal, which is asserted during discharge of high voltage nodes 102. When control signal 'dischgb' is de-asserted, the discharge paths by pulling terminal 107 to ground reference voltage during programming mode, thus allowing the high voltage nodes to charge up during programming mode. Control signal "erase" is asserted (i.e., at a logic high voltage) and pulls all the high voltage nodes to ground reference voltage during erase operation.

When control signal "erase" is not asserted and switched from logic high to a logic low voltage, control signal "dischgb" switches from a logic high voltage ("programming state") to a logic low voltage ("discharge state"), NMOS transistors 205 and 204 are not conducting. PMOS transistor 201, which receives a bias voltage at a gate terminal 220 (i.e., control signal "biasp"), causes a reference current $I_{ref}$ in PMOS transistor 202 and NMOS transistors 203 and 206, thus setting a reference voltage level at terminal 108 to which high voltage nodes 102 can discharge. Further, another reference voltage is set up at terminal 107, so that a discharge current $I_{discharge}$ in NMOS transistor 103 can flow.

Each high voltage node is discharging to the voltage at terminal 108. For N bit lines (i.e., 102 includes N high voltage nodes to be discharged), the total current in NMOS transistor 206 is $N*I_{ref}$. The voltage at terminal 108 rises to allow NMOS transistor 206 to sink more current and elevates the voltage at terminal 107, thus maintaining current $I_{ref}$ in NMOS transistor 203 and current $I_{discharge}$ in NMOS transistor 103, and providing the same discharge current in each bit line.

Circuit 200 self-limits the total discharge current. As N increases, i.e., the number of bit lines to be discharge increases, terminals 107 and 108 can rise until terminal 107 is at supply voltage $V_{CC}$ and terminal 108 is at $V_{CC}-V_{TN}$, $V_{TN}$ being the threshold voltage of NMOS transistor 103. At that value of N, the total discharge current is limited by the gate voltage $V_{CC}-V_{TN}$ at NMOS transistor 206, so that the total discharge current $I_{max}$ in each bit line is limited by $I_{max}$ divided by N.

As high voltage nodes 102 are gradually discharged, the voltage at terminal 108 gradually drops until it falls below the trip point of reference voltage detector 105, which then provides a logic low voltage at terminal 223 to enable high voltage strobe enable/disable circuit 106.

After high voltage nodes 102 are discharging to the reference voltage (approx. 1 $V_{TN}$), the circuit that includes PMOS transistors 207 and 211, NMOS transistors 209 and 210 provides additional source current to terminal 108 to maintain its voltage at reference current level $I_{ref}$. Due to additional leakage at terminal 108 through each bit line, the leakage current can pull terminal 108 to below the desired reference voltage, if $I_{ref}$ supplied by PMOS transistor 202 is small. Transistors 207, 208 and 209 duplicate transistors 201, 202 and 203, respectively (likewise receiving bias control voltage "biasp"), so that the gate voltage of transistor 210 is the same voltage as the voltage of terminal 107. The leakage current can then be provided by transistor 210, which can be made to source a higher current than transistor 103.

When control signal "erase" is asserted, PMOS transistor 211 is not conducting and NMOS transistor 205 is conducting. The voltage at terminal 108 is pulled to ground voltage.

The above detailed description is provided to illustrate the embodiments of the present invention above, and is not intended to be limiting. Numerous variations and modifications within the scope of the present invention are possible. The present invention is set forth in the following claims.

I claim:

1. A high voltage discharge circuit for discharging a high voltage node, comprising:

a current path providing between said high voltage node and a ground voltage, said current path including an input terminal and an output terminal and conducting a current whose magnitude is limited by a control voltage between a supply voltage and said ground voltage, said supply voltage being less than an initial voltage at said high voltage node; and a reference voltage circuit for generating said control voltage, wherein said reference voltage circuit precharges said output terminal to said supply voltage less, a threshold voltage of a predetermined transistor.

2. A discharge circuit for discharging a high voltage node, comprising:

a current path providing between said high voltage node and a ground voltage, said current path conducting a current whose magnitude is limited by a control voltage, and comprising a transistor coupled between said high voltage node and said ground voltage, and wherein said control voltage is provided across the gate and source terminals of said transistor;

a reference voltage circuit for generating said control voltage, comprising a current source coupled to said transistor in a current mirror configuration; and a voltage detector circuit coupled for detecting the voltage at said source terminal of said transistor, said voltage detector circuit providing an output control signal indicating completion of discharging said high voltage node.

3. A high voltage discharge circuit as in claim 2, further comprising an enable circuit latching said output control signal.

4. A method for discharging a high voltage node, comprising:

providing a current path between said high voltage node and a ground voltage, said current path conducting a current whose magnitude is limited by a control voltage between a supply voltage and said ground voltage, said supply voltage being less than an initial voltage of said high voltage node, said current path comprising a transistor coupled between said high voltage node and said ground voltage;

generating said control voltage by a reference voltage circuit, said control voltage being provided across the gate and source terminals of said transistor; and precharging said source terminal of said transistor to a supply voltage less a, threshold voltage of a predetermined transistor.

5. A method for discharging a high voltage node, comprising:

providing a current path between said high voltage node and a ground voltage, said current path conducting a current whose magnitude is limited by a control voltage, said current path comprising a transistor coupled between said high voltage node and said ground voltage;

generating said control voltage by a reference voltage circuit, said control voltage being provided across the gate and source terminals of said transistor by a current source coupled to said transistor in a current mirror configuration; and providing a voltage detector circuit coupled for detecting the voltage at said source terminal of said transistor, said voltage detector circuit providing an output control signal indicating completion of discharging said high voltage node.

6. The method of claim 5, further comprising providing an enable circuit latching said output control signal.

* * * * *